United States Patent
Zhang et al.

(10) Patent No.: US 9,940,951 B2
(45) Date of Patent: Apr. 10, 2018

(54) PMR WRITER WITH NON-CONFORMAL SIDE GAPS

(71) Applicant: Western Digital (Fremont), LLC, Fremont, CA (US)

(72) Inventors: Jinqiu Zhang, Fremont, CA (US); Feng Liu, San Ramon, CA (US); Xiaoyu Yang, Union City, CA (US); Ming Jiang, San Jose, CA (US); Xiaotian Zhou, Fremont, CA (US); Zeyu Ma, Dublin, CA (US); Hai Sun, Milpitas, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 94 days.

(21) Appl. No.: 15/053,211

(22) Filed: Feb. 25, 2016

(65) Prior Publication Data

US 2016/0171992 A1   Jun. 16, 2016

Related U.S. Application Data

(63) Continuation of application No. 14/046,790, filed on Oct. 4, 2013, now Pat. No. 9,275,657.
(Continued)

(51) Int. Cl.
G11B 5/235    (2006.01)
G11B 5/11     (2006.01)
(Continued)

(52) U.S. Cl.
CPC ............ *G11B 5/1278* (2013.01); *G11B 5/10* (2013.01); *G11B 5/11* (2013.01); *G11B 5/112* (2013.01); *G11B 5/187* (2013.01); *G11B 5/232* (2013.01); *G11B 5/235* (2013.01); *G11B 5/315* (2013.01); *G11B 5/3116* (2013.01);
(Continued)

(58) Field of Classification Search
None
See application file for complete search history.

(56) References Cited

U.S. PATENT DOCUMENTS 5,277,749 A * 1/1994 Griffith et al.
5,386,332 A * 1/1995 Jagielinski et al.
(Continued)

FOREIGN PATENT DOCUMENTS

JP    2006-331612    12/2006

OTHER PUBLICATIONS

Final Office Action issued on U.S. Appl. No. 14/046,790 dated Dec. 4, 2014.
(Continued)

*Primary Examiner* — Craig A. Renner
(74) *Attorney, Agent, or Firm* — Foley & Lardner LLP

(57) ABSTRACT

A perpendicular magnetic recording (PMR) writer is configured to magnetically record data on a rotatable disk surface. The PMR writer including a pole tip, side shields, an air-bearing surface (ABS) region, a yoke region comprising Silicon Dioxide (SiO2), side gaps and a plurality of throat regions. The side gaps are arranged respectively between the pole tip and the side shields and include SiO2. A side gap width of the plurality of throat regions increases with a side shield throat height above the ABS region for each of the throat regions. The side gap width has a different width variation in each of the throat regions.

14 Claims, 13 Drawing Sheets

Related U.S. Application Data

(60) Provisional application No. 61/865,666, filed on Aug. 14, 2013.

(51) Int. Cl.
| | |
|---|---|
| *G11B 5/127* | (2006.01) |
| *G11B 5/23* | (2006.01) |
| *G11B 5/187* | (2006.01) |
| *G11B 5/10* | (2006.01) |
| *G11B 5/60* | (2006.01) |
| *H01L 21/027* | (2006.01) |
| *H01L 21/3213* | (2006.01) |
| *G11B 5/147* | (2006.01) |
| *G11B 5/31* | (2006.01) |

(52) U.S. Cl.
CPC .......... *G11B 5/3146* (2013.01); *G11B 5/3163* (2013.01); *G11B 5/6082* (2013.01); *G11B 5/147* (2013.01); *G11B 5/1878* (2013.01); *G11B 5/313* (2013.01); *H01L 21/0272* (2013.01); *H01L 21/32134* (2013.01); *H01L 21/32139* (2013.01); *Y10T 29/49032* (2015.01); *Y10T 29/49041* (2015.01); *Y10T 29/49043* (2015.01)

(56) References Cited

U.S. PATENT DOCUMENTS

| | | | |
|---|---|---|---|
| 5,801,910 A * | 9/1998 | Mallary | |
| 6,016,290 A * | 1/2000 | Chen et al. | |
| 6,018,441 A * | 1/2000 | Wu et al. | |
| 6,025,978 A * | 2/2000 | Hoshi et al. | |
| 6,025,988 A * | 2/2000 | Yan | |
| 6,032,353 A * | 3/2000 | Hiner et al. | |
| 6,103,073 A * | 8/2000 | Thayamballi | |
| 6,108,166 A * | 8/2000 | Lederman | |
| 6,118,629 A * | 9/2000 | Huai et al. | |
| 6,118,638 A * | 9/2000 | Knapp et al. | |
| 6,178,070 B1 * | 1/2001 | Hong et al. | |
| 6,229,782 B1 * | 5/2001 | Wang et al. | |
| 6,230,959 B1 * | 5/2001 | Heist et al. | |
| 6,233,116 B1 * | 5/2001 | Chen et al. | |
| 6,237,215 B1 * | 5/2001 | Hunsaker et al. | |
| 6,252,743 B1 * | 6/2001 | Bozorgi | |
| 6,266,216 B1 * | 7/2001 | Hikami et al. | |
| 6,271,604 B1 * | 8/2001 | Frank, Jr. et al. | |
| 6,275,354 B1 * | 8/2001 | Huai et al. | |
| 6,445,553 B2 * | 9/2002 | Barr et al. | |
| 6,445,554 B1 * | 9/2002 | Dong et al. | |
| 6,447,935 B1 * | 9/2002 | Zhang et al. | |
| 6,448,765 B1 * | 9/2002 | Chen et al. | |
| 6,451,514 B1 * | 9/2002 | Iitsuka | |
| 6,452,742 B1 * | 9/2002 | Crue et al. | |
| 6,452,765 B1 * | 9/2002 | Mahvan et al. | |
| 6,456,465 B1 * | 9/2002 | Louis et al. | |
| 6,459,552 B1 * | 10/2002 | Liu et al. | |
| 6,852,472 B2 * | 2/2005 | Lee et al. | |
| 7,002,775 B2 * | 2/2006 | Hsu et al. | |
| 7,012,832 B1 * | 3/2006 | Sin et al. | |
| 7,100,266 B2 * | 9/2006 | Plumer et al. | |
| 7,110,289 B1 * | 9/2006 | Sin et al. | |
| 7,444,740 B1 * | 11/2008 | Chung et al. | |
| 8,031,433 B2 * | 10/2011 | Yan et al. | |
| 8,056,213 B2 * | 11/2011 | Han et al. | |
| 8,220,140 B1 | 7/2012 | Wang et al. | |
| 8,222,599 B1 | 7/2012 | Chien | |
| 8,665,561 B1 | 3/2014 | Knutson et al. | |
| 8,670,211 B1 | 3/2014 | Sun et al. | |
| 8,670,213 B1 | 3/2014 | Zeng et al. | |
| 8,670,214 B1 | 3/2014 | Knutson et al. | |
| 8,670,294 B1 | 3/2014 | Shi et al. | |
| 8,670,295 B1 | 3/2014 | Hu et al. | |
| 8,675,318 B1 | 3/2014 | Ho et al. | |
| 8,675,455 B1 | 3/2014 | Krichevsky et al. | |
| 8,681,594 B1 | 3/2014 | Shi et al. | |
| 8,689,430 B1 | 4/2014 | Chen et al. | |
| 8,693,141 B1 | 4/2014 | Elliott et al. | |
| 8,703,397 B1 | 4/2014 | Zeng et al. | |
| 8,705,205 B1 | 4/2014 | Li et al. | |
| 8,711,518 B1 | 4/2014 | Zeng et al. | |
| 8,760,808 B2 | 6/2014 | Heim et al. | |
| 8,792,208 B1 | 7/2014 | Liu et al. | |
| 8,793,866 B1 | 8/2014 | Zhang et al. | |
| 2003/0076630 A1 * | 4/2003 | Sato et al. | |
| 2012/0298621 A1 | 11/2012 | Gao | |
| 2013/0216702 A1 * | 8/2013 | Kaiser et al. | |
| 2013/0216863 A1 * | 8/2013 | Li et al. | |
| 2013/0257421 A1 * | 10/2013 | Shang et al. | |
| 2014/0175050 A1 * | 6/2014 | Zhang et al. | |

OTHER PUBLICATIONS

Mallary et al., "One Terabit per Square Inch Perpendicular Recording Conceptual Design", IEEE Transactions on Magnetics, vol. 38, No. 4, Jul. 2002, pp. 1719-1724.

Non-Final Office Action issued on U.S. Appl. No. 14/046,790, dated Jul. 9, 2014.

* cited by examiner

Fig. 5
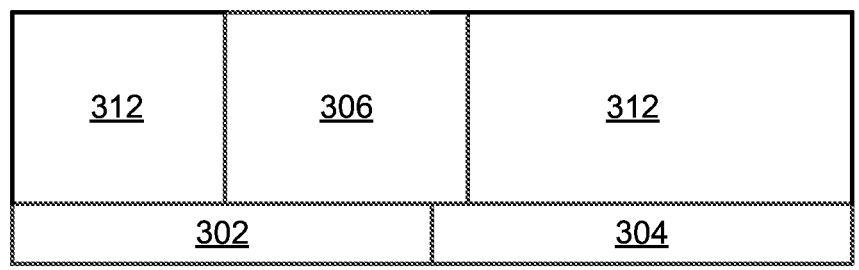
SIDE VIEW
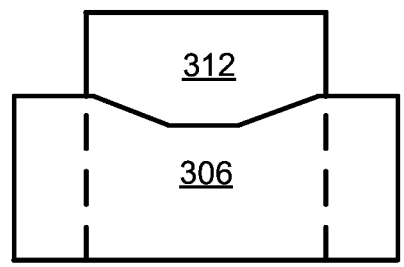
TOP VIEW

Fig. 6
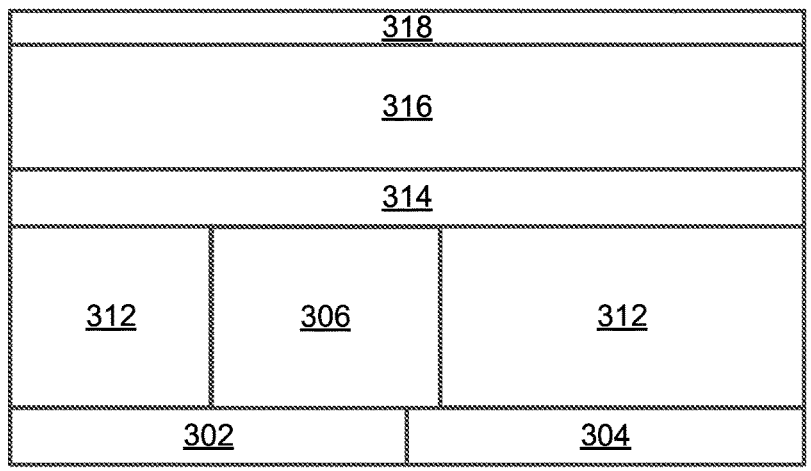
SIDE VIEW
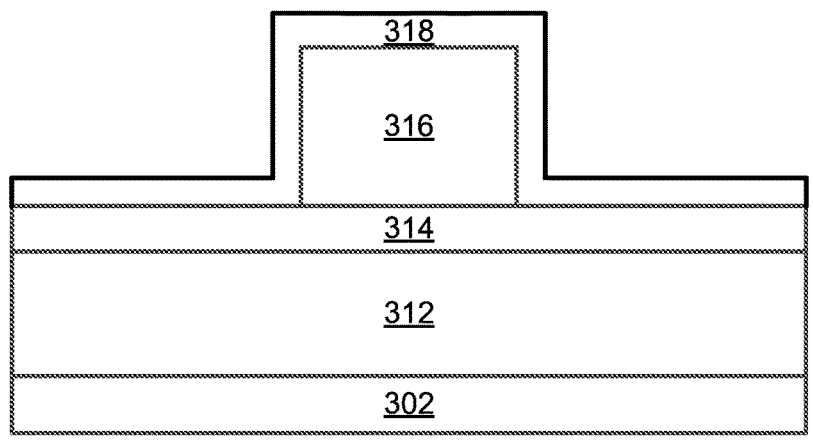
CROSS SECTION - YOKE VIEW
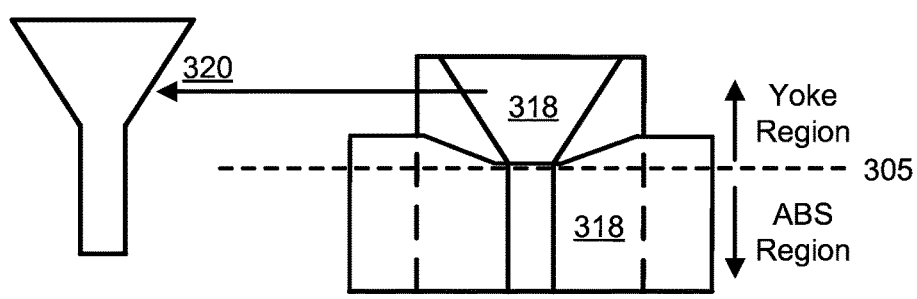
TOP VIEW

Fig. 7
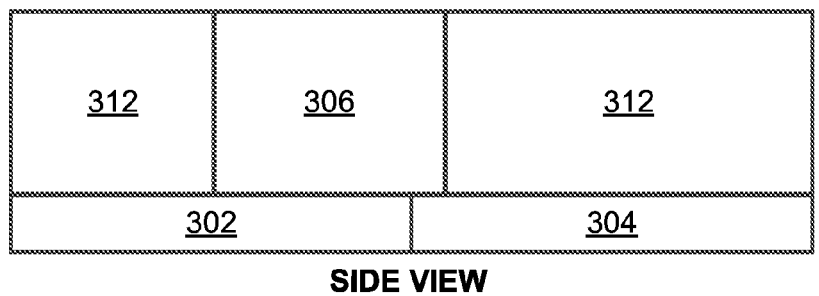
SIDE VIEW
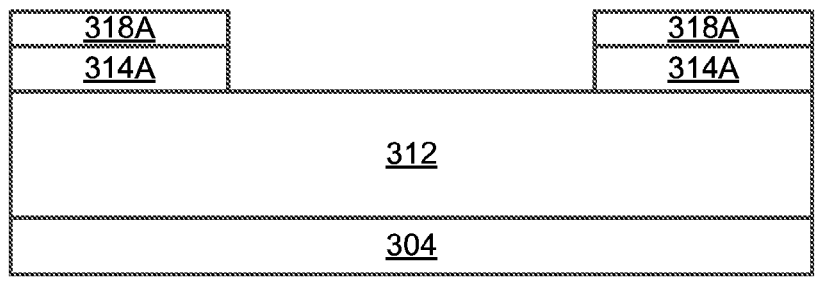
CROSS SECTION - ABS VIEW
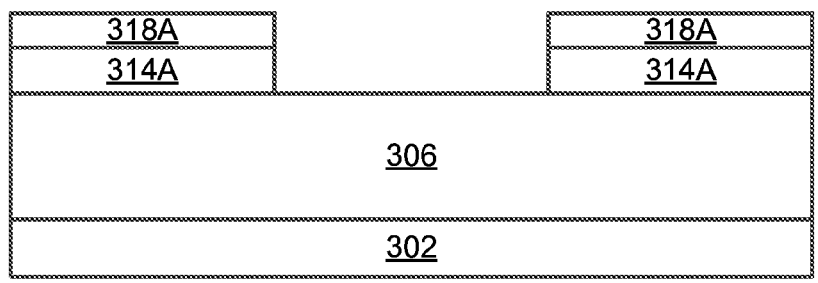
CROSS SECTION - YOKE VIEW
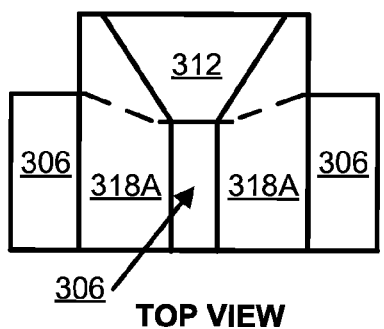
TOP VIEW

Fig. 8
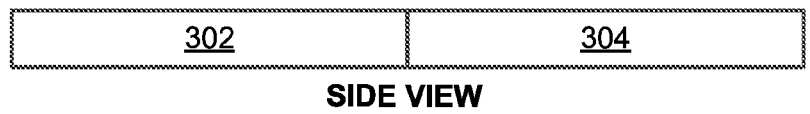
SIDE VIEW
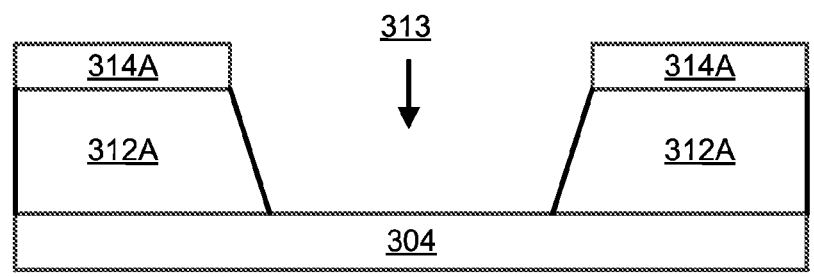
CROSS SECTION - YOKE VIEW
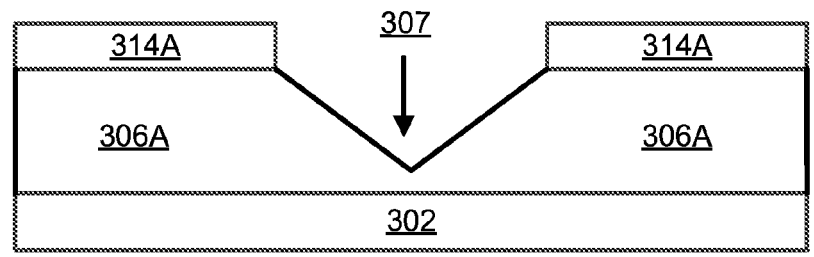
CROSS SECTION - ABS VIEW
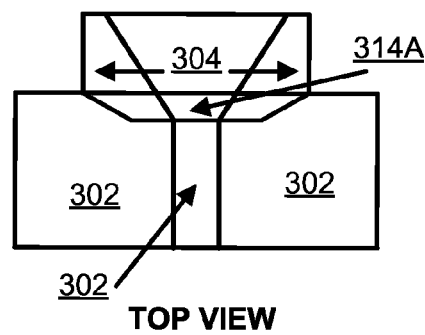
TOP VIEW

Fig. 9
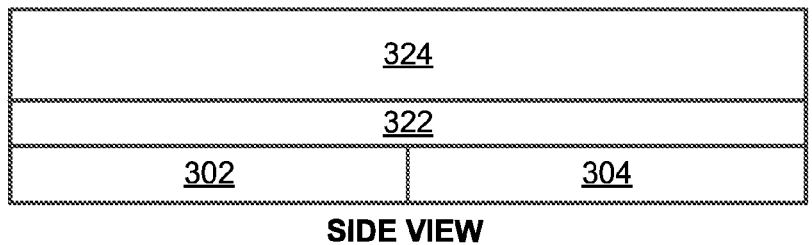
SIDE VIEW
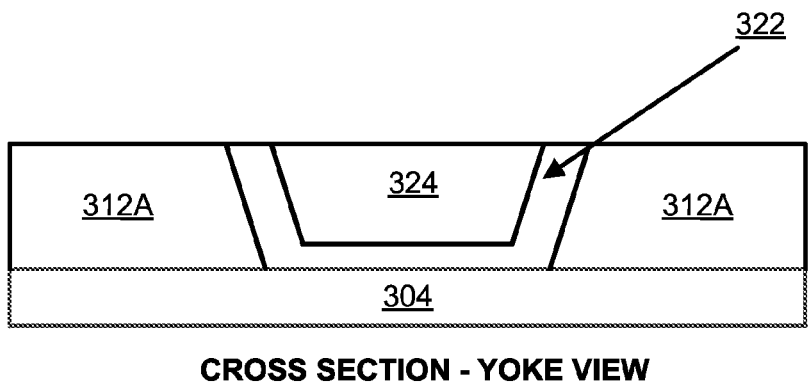
CROSS SECTION - YOKE VIEW
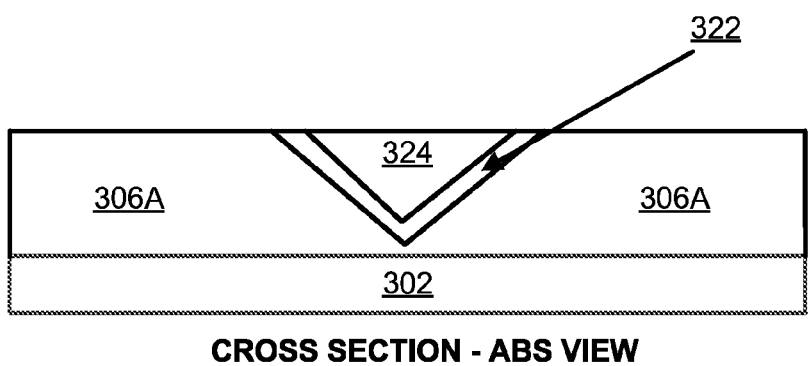
CROSS SECTION - ABS VIEW
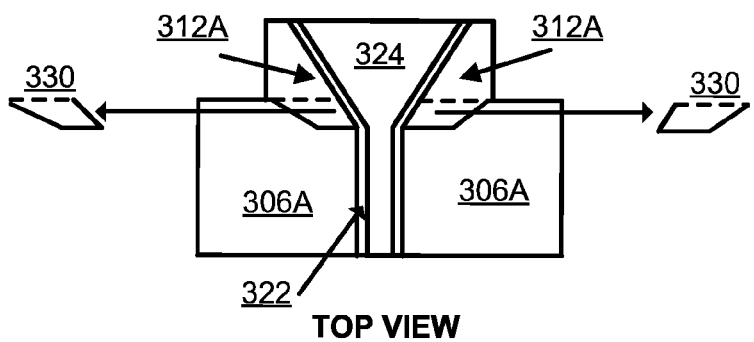
TOP VIEW

Fig. 10
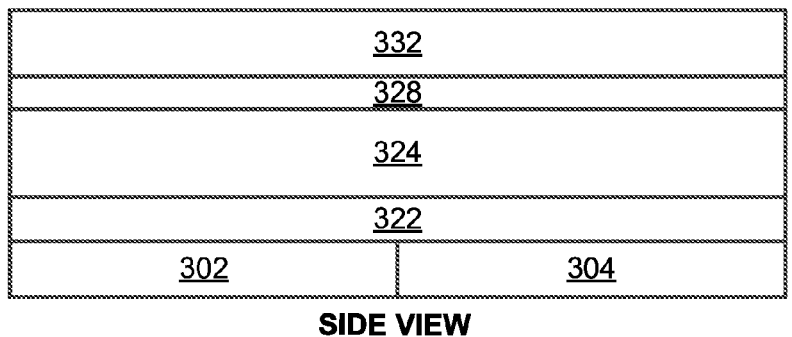
SIDE VIEW
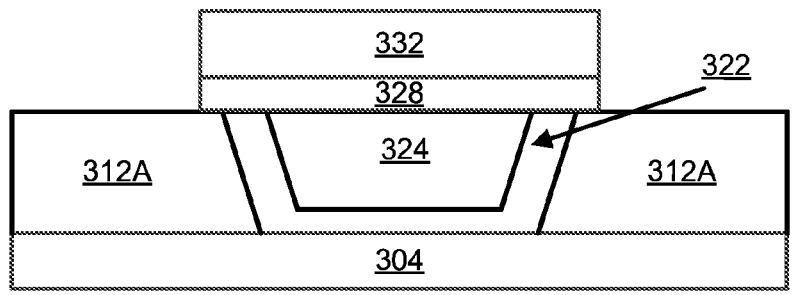
CROSS SECTION - YOKE VIEW
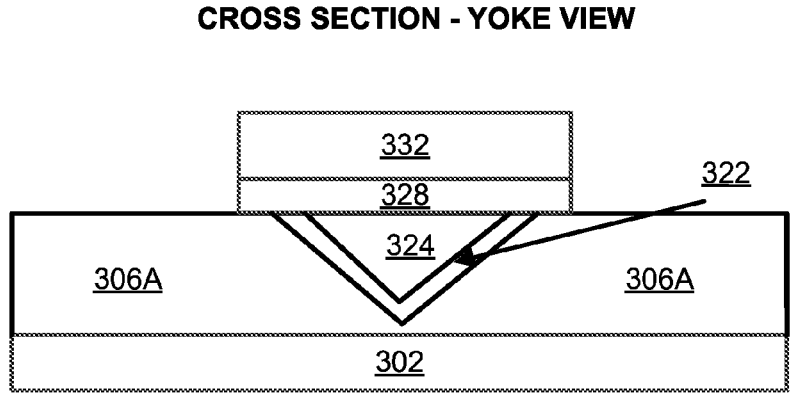
CROSS SECTION - ABS VIEW
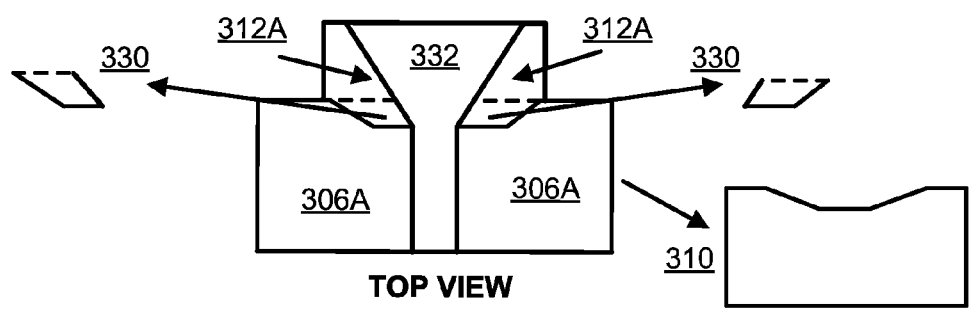
TOP VIEW

Fig. 11
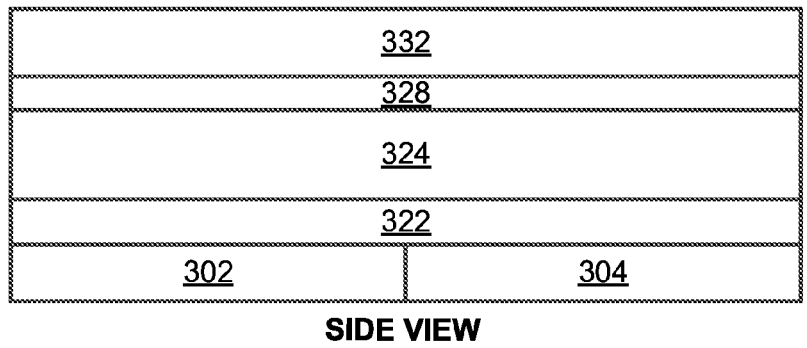
SIDE VIEW
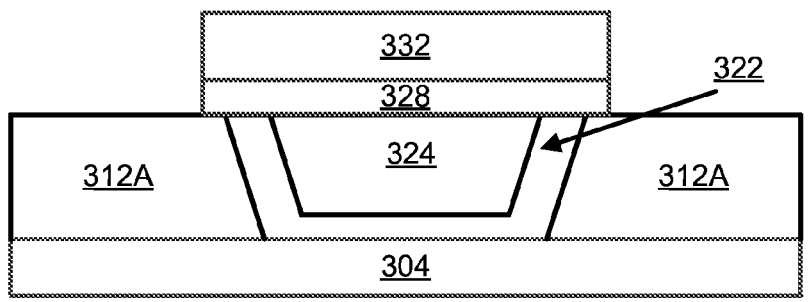
CROSS SECTION - YOKE VIEW
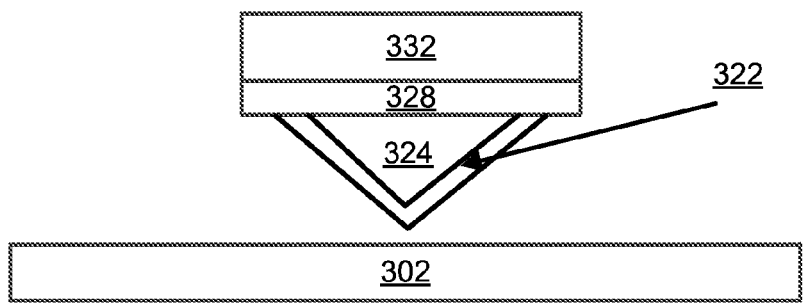
CROSS SECTION - ABS VIEW
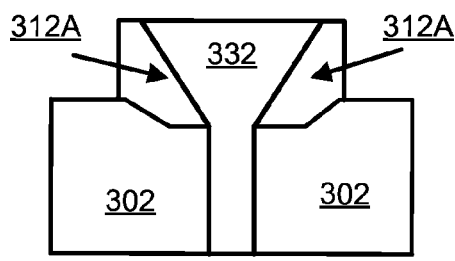
TOP VIEW

Fig. 12
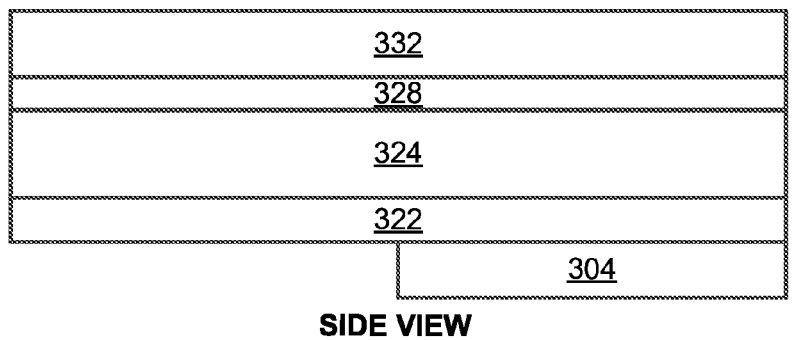
SIDE VIEW
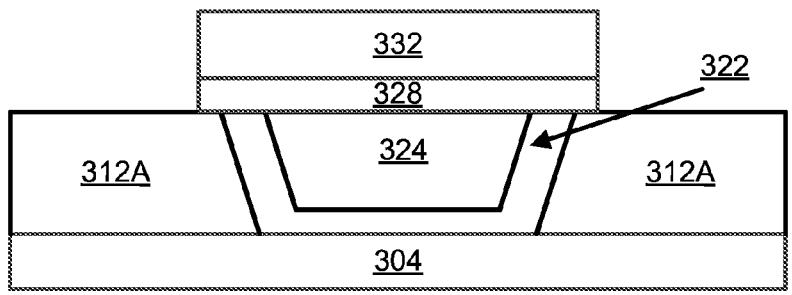
CROSS SECTION - YOKE VIEW
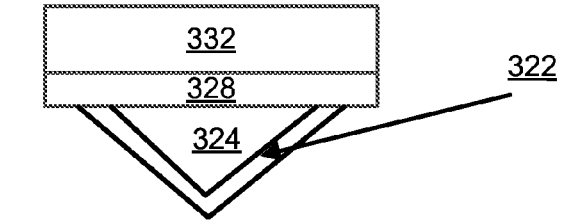
CROSS SECTION - ABS VIEW
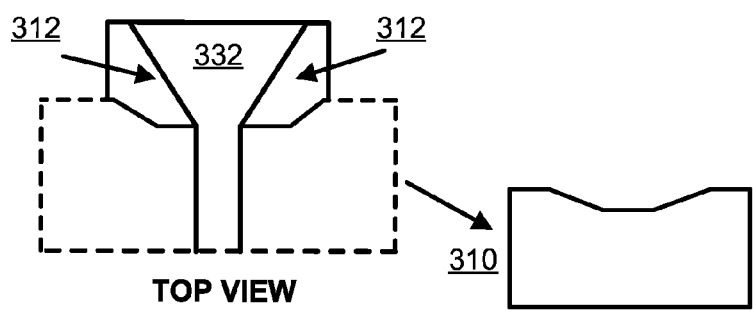
TOP VIEW

Fig. 13
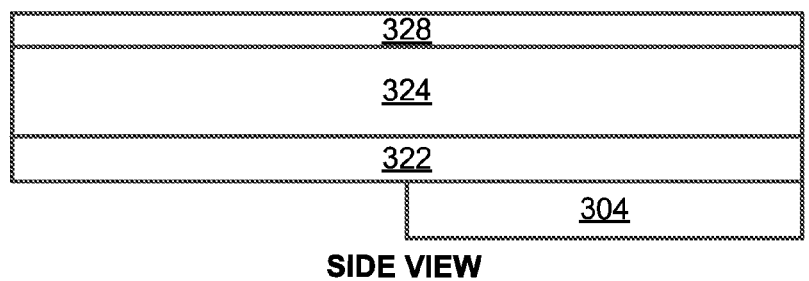
SIDE VIEW
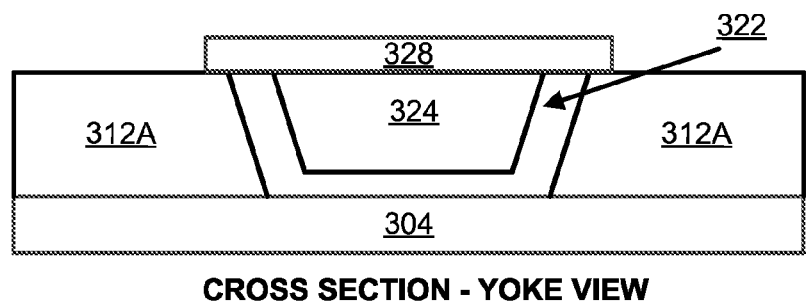
CROSS SECTION - YOKE VIEW
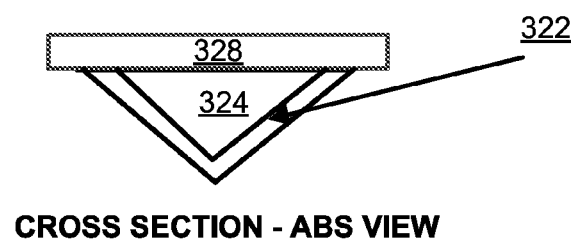
CROSS SECTION - ABS VIEW
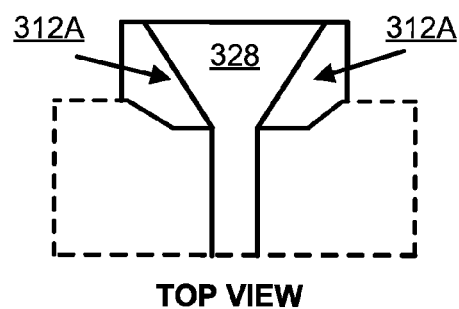
TOP VIEW

Fig. 14
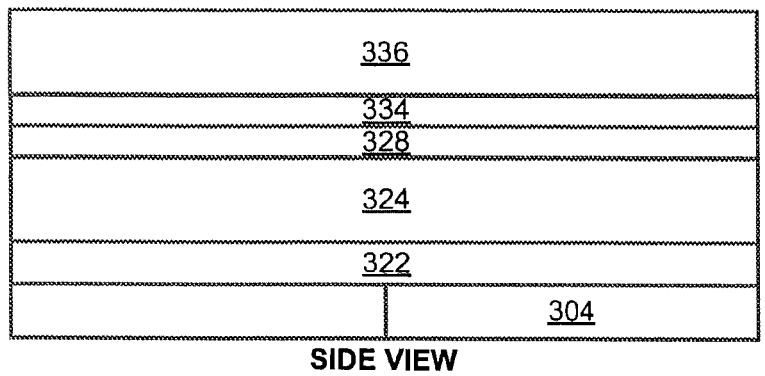
SIDE VIEW
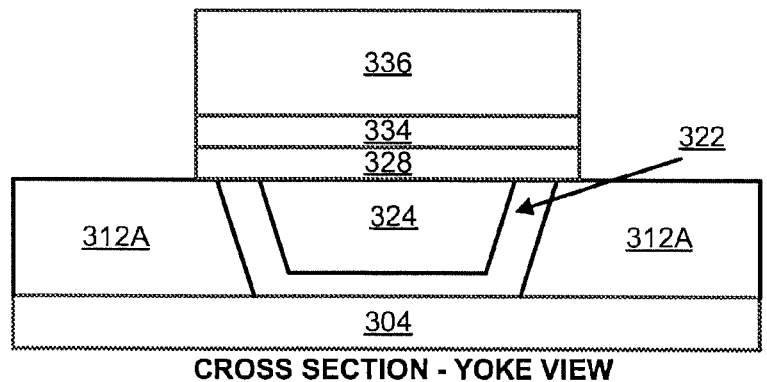
CROSS SECTION - YOKE VIEW
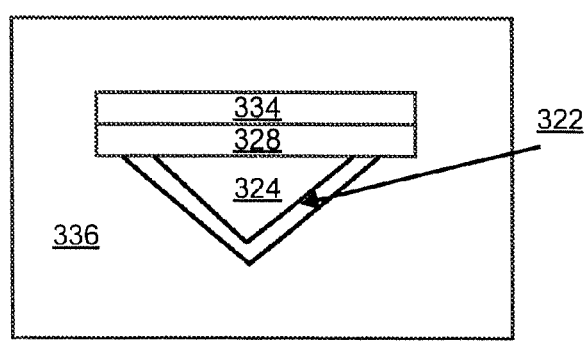
CROSS SECTION - ABS VIEW
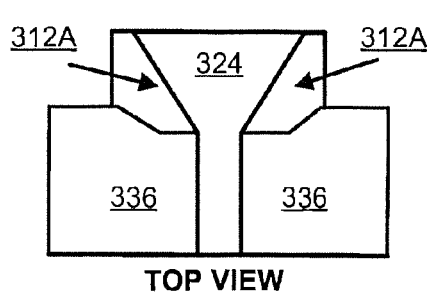
TOP VIEW

PMR WRITER WITH NON-CONFORMAL SIDE GAPS

CROSS-REFERENCE TO RELATED APPLICATIONS

This application is a continuation of and claims priority to U.S. patent application Ser. No. 14/046,790, filed Oct. 4, 2013, which claims priority to U.S. Provisional Patent Application No. 61/865,666, filed Aug. 14, 2013, both of which are incorporated herein by reference in their entireties.

BACKGROUND

PMR systems have been developed to meet the growing demand for improved magnetic disk drive data rate and capacity. Damascene processes may be used to build up structures for use in a PMR writer head, as opposed to methods which rely upon material removal to form such structures. As applied to the formation of PMR writing heads, the damascene process involves forming trapezoidal trenches in a material, and then depositing (e.g., electroplating) a magnetic pole material into the trenches to form write poles. The PMR writer pole is the trapezoidal formation of the magnetic material deposited in the trapezoidal trench etched in a surrounding material.

With the ever increasing need for higher recording areal densities (for example, almost 1 TB/in2), improved processes for manufacturing PMR writers with wrap around shields (WAS) continue to be developed. Writer pole tip physical geometry may be decreased to meet the required magnetic pole write width and track pitch for higher areal density writers (e.g. Firebird and Barbados class).

However, such a geometry reduction may produce a significant write field and reverse overwrite loss. To avoid this problem, PMR writers with non-conformal side gaps may be fabricated. Accordingly, improved processes for manufacturing PMR writer heads with non-conformal side gaps are needed.

BRIEF DESCRIPTION OF THE DRAWINGS

The present application is illustrated by way of example, and not limitation, in the figures of the accompanying drawings in which:

FIGS. 3-14 are diagrams illustrating an exemplary embodiment of a PMR writer pole during fabrication in accordance with the process of FIG. 2.

DETAILED DESCRIPTION

In the following description, numerous specific details are set forth, such as examples of specific layer compositions and properties, to provide a thorough understanding of various embodiment of the preside sent invention. It will be apparent however, to one skilled in the art that these specific details need not be employed to practice various embodiments of the present invention. In other instances, well known components or methods have not been described in detail to avoid unnecessarily obscuring various embodiments of the present invention.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. By contrast, a first layer "on" a second layer is in contact with that second layer. Additionally, the relative position of one layer with respect to other layers is provided assuming operations are performed relative to a substrate without consideration of the absolute orientation of the substrate.

Figure 1:
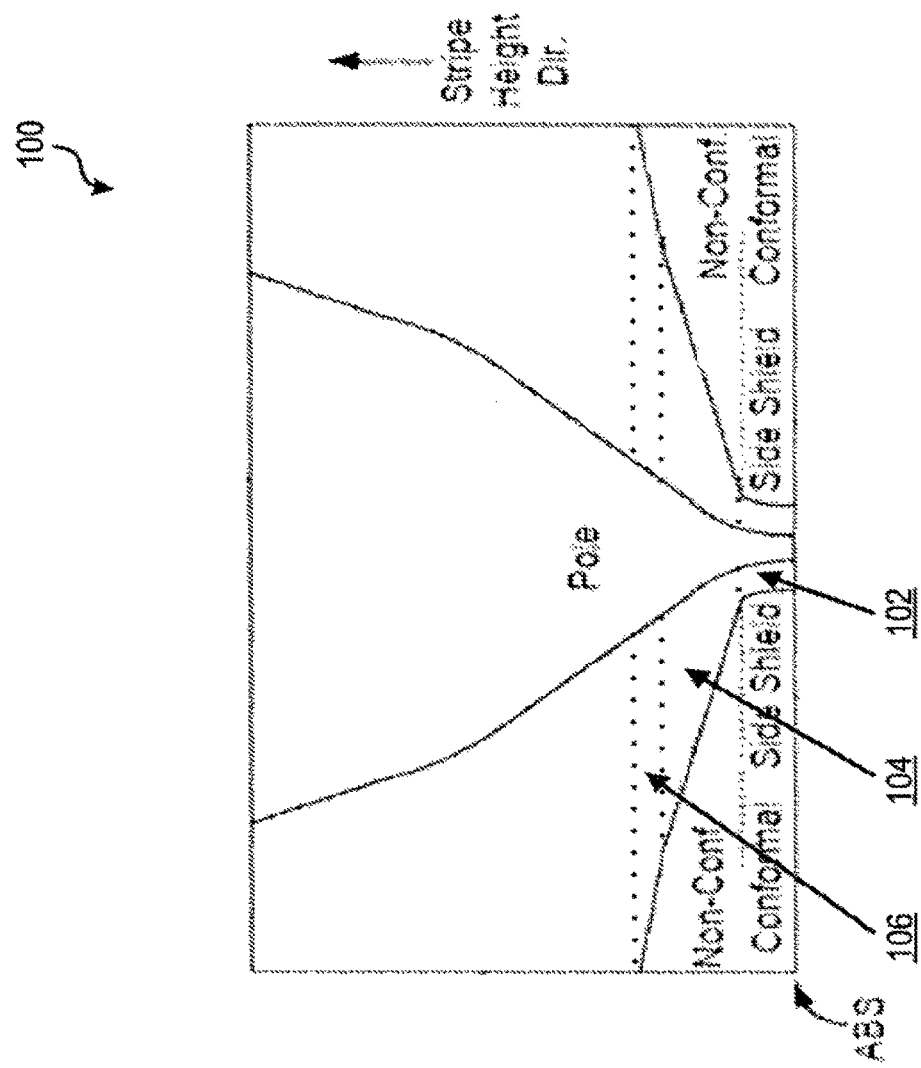
FIG. 1 illustrates a PMR writer pole with non-conformal side gaps that may be manufactured using the disclosed process.

FIG. 1 illustrates a top view of an example PMR writer pole 100 with non-conformal side gaps that may be manufactured using the disclosed process (described below). In a PMR write head with a non-conformal integrated side shield structure, the sidewalls of the side shield are not parallel to the sidewalls of the pole tip. Thus, the side gap distance between the pole tip edge and side shield is variable from the trailing to the lead edges of the pole tip. The presence of these side gaps may significantly improve on track writer performance (~2 dB or more ReOVW) by reducing side fringing. In the illustrated embodiment, the side gap increases with side shield throat height from the air-bearing surface (ABS) region to the yoke region of the writer pole. As illustrated by FIG. 1, the PMR writer pole may include a plurality of throat regions 102, 104 and 106. In any individual region, the side gap width may have a different variation. For example, in one embodiment, region 102 varies in width from approximately 10 nm to 20 nm, region two varies in width from approximately 10 nm to 60 nm, and region three varies in width from approximately 60 nm to 80 nm. In the illustrated embodiment, region 102 may correspond to the ABS region for the pole and regions 104 and 106 may correspond to a yoke region for the pole.

FIGS. 2-14 illustrate an exemplary process for fabricating a full wrap around shield (FWAS) PMR writer main pole with non-conformal side gaps as shown in FIG. 1. This process presents several benefits. The process manufactures PMR writer poles with non-conformal side gaps, which significantly improve on track writer. Additionally, this process manufactures trenches using operational requirements that are comparable to Aluminium Oxide (Al2O3) based processes. Moreover, this process helps reduce the manufacturing operations needed to manufacture hard drives with a recording areal density of approximately 700 Gb/in$^2$ and greater.

Figure 2:
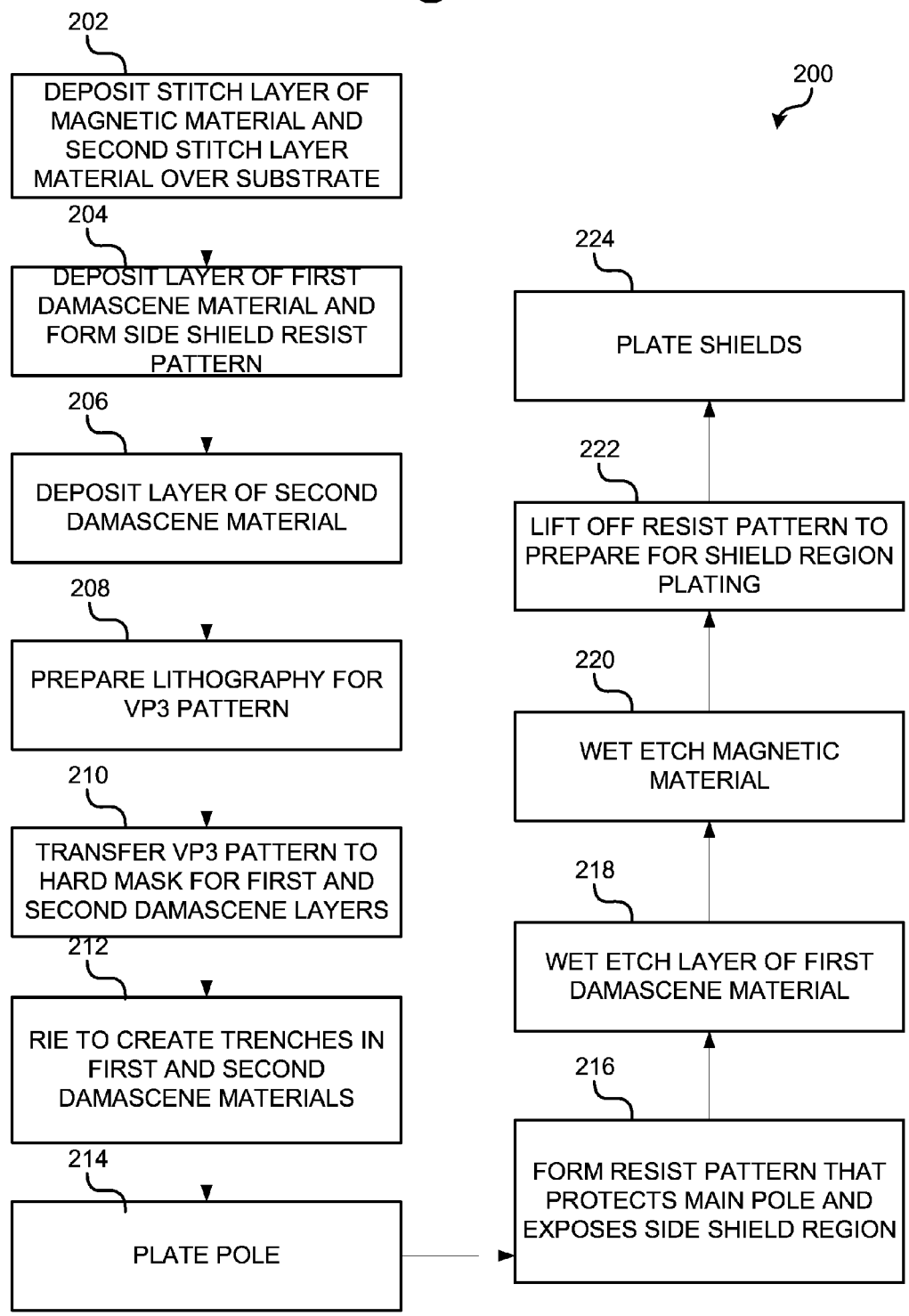
FIG. 2 is a flowchart describing a process used for manufacturing a PMR writer pole with non-conformal side gaps.
Figure 3:
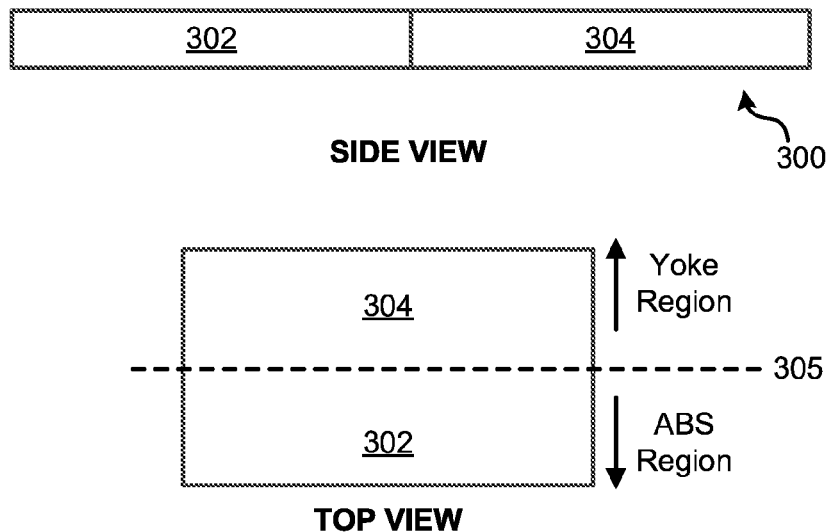
Figure 4:
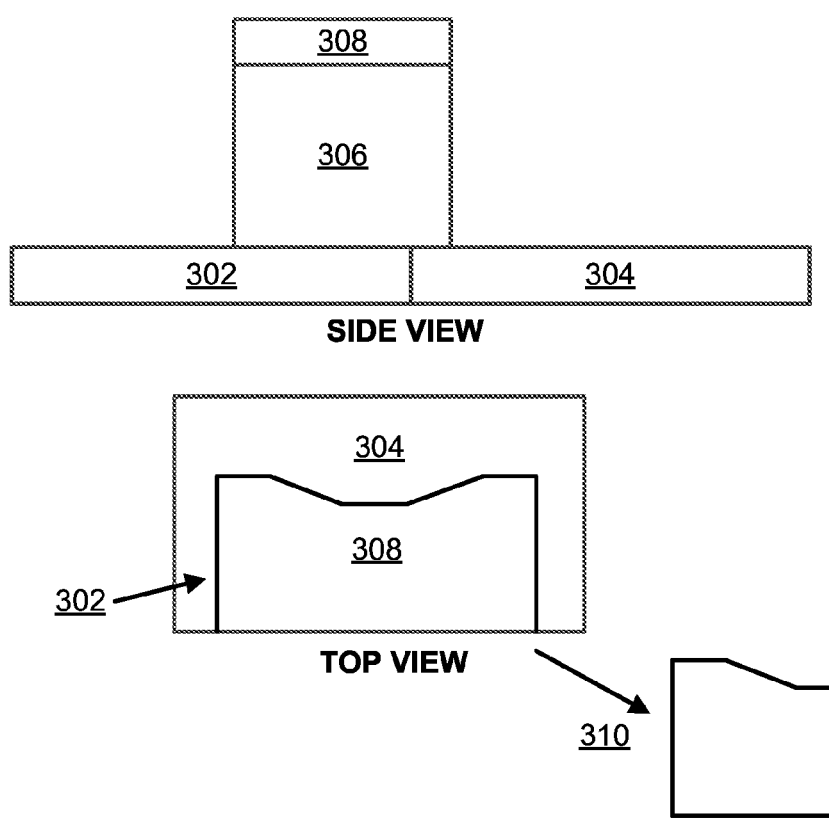

FIGS. 3-14 illustrate side, cross-sectional, and top views of the PMR pole after various process operations and will be described in conjunction with FIG. 2, which details the process operations themselves.

For simplicity, some process operations may be omitted. The PMR writer pole being fabricated may be part of a merged head that also includes a read head (not shown) and resides on a slider (not shown) in a disk drive. The process 200 also may commence after formation of other portions of the PMR writer pole.

At operation 202, a stitch layer comprising a magnetic material 302 and second stitch layer material 304 is deposited over a substrate 300. In the illustrated embodiment, the magnetic material 302 comprises a Nickel-Iron (NiFe) alloy and the second stitch layer material 304 comprises Ruthenium (Ru).

At operation 204, a first damascene layer 306 (or first layer of damascene material) is deposited and a side shield region 310 is formed in first damascene layer 306. Formation of side shield region 310 may be performed using any lithographic process such as photolithography. In the illustrated embodiment, the side shield region 310 is formed by depositing a hard mask 308 over the first damascene layer 306, depositing a side shield patterned photoresist (not pictured) over hard mask 308, etching hard mask 308, and then etching damascene layer 306. Hard mask layer 308 may comprise Chromium (Cr) or Ruthenium (Ru) or any other material that has a high etching selectivity with respect to the material being patterned, i.e. the material used in damascene layer 306. In the illustrated embodiment, first damascene layer 306 comprises Aluminium Oxide (Al2O3).

At operation 206, a second damascene layer 312 (or second layer of damascene material) is deposited and planarized. In one embodiment, planarization is performed using a chemical mechanical planarization (CMP) process. In another embodiment, planarization may be performed using an ion beam milling process. As illustrated by FIG. 5, planarization removes hard mask 308 and exposes first damascene layer 306. As illustrated in the side view, planarization may be used to level the top of the second damascene layer 312 with the first damascene layer 306. In this exemplary embodiment, the second damascene layer 312 comprises Silicon Dioxide (SiO2).

The structure is then prepared for a PMR main pole formation at operation 208. As illustrated by FIG. 6, the structure is prepared for a lithography process by depositing photo adhesion layer 314, a resist pattern layer 316, and hard mask 318. In the illustrated embodiment, resist pattern layer 316 has a writer main pole photo pattern (VP3 photo pattern) 320, which comprises a yoke and ABS pattern. Photo adhesion layer 314 may comprise Chromium (Cr) or Ruthenium (Ru) or any other material that has a high etching selectivity with respect to the material being patterned, i.e. the material used in the first damascene layer and the material used in the second damascene layer. Hard mask layer 318 may comprise Tantalum (Ta), Titanium (Ti), or any other material that has a high etching selectivity with respect to hard mask layer 314.

The first damascene layer 306 and second damascene layer 312 may later be etched (described below) to form a yoke and ABS region of a PMR main pole as indicated by pattern 320. The yoke region corresponds to the pole's yoke and may be etched out of the second damascene layer 312. The ABS region corresponds to the region from the ABS (i.e. pole tip) to the start of the yoke region (i.e. neck area of pole) and may be etched out of the first damascene layer 306. The separation boundary 305 between the yoke region and ABS region of the PMR pole (not yet etched) may be defined as the separation boundary between first damascene layer 306 and second damascene layer 312. Accordingly, the distance from the ABS to the separation boundary is the distance that the yoke region is from or behind the ABS. During a VP3 lithography (described below), the placement of a resist mask with pattern relative to the substrate may define the placement of the separation boundary. In some embodiments, the yoke region (separation boundary) may be 100 to 600 nm behind the ABS. In the embodiment illustrated by process 200, the yoke region is approximately 200 nm behind the ABS.

At operation 210, the VP3 Pattern is transferred to layer 314. In one exemplary embodiment, formation of the VP3 pattern in layer 314 proceeds as follows. Hard mask layer 318 is side milled to remove it from lateral sides of the resist pattern layer 316 (illustrated from the side views of FIGS. 6 and 7). Side milling exposes some portions (e.g. lateral sides) of the resist pattern layer 316 so that an etchant can access the layer during an etching operation. Resist pattern layer 316 and hard mask layer 318 may then be lifted off to transfer the ABS region and yoke region pattern from the resist pattern layer 316 to hard mask layer 318. This forms a corresponding ABS region and yoke region opening in layer 318. Thus, a hard mask layer 318A has been formed. Photo adhesion layer 314 is then etched using hard mask layer 318A as a hard mask. In this exemplary process a reactive ion etch (RIE) is performed. The RIE transfers the yoke and ABS region openings from hard mask layer 318A to photo adhesion layer 314. Thus, a layer 314A has been formed from hard mask 318A.

At operations 212-214, a PMR main pole is formed. At operation 212, the first damascene layer and the second damascene layer are etched using photo adhesion layer 314A as a hard mask. In this exemplary process a ME process is performed. The RIE process may comprise one or more RIE operations. As illustrated in FIG. 8, the ME forms a first damascene layer 306A and a second damascene layer 312A. First damascene layer 306A may have a trench opening 307 corresponding to the ABS region of the formed pole opening. Second damascene layer 312A may have a trench opening 313 corresponding to the yoke region of the formed pole opening.

The trenches may then be plated at operation 214. The plating operation 214 may include depositing a non-magnetic gap layer 322 in trenches 307 and 313, and over first damascene layer 306A and second damascene layer 312A. Layer 322 serves as a seed layer for a PMR main pole plating. In one embodiment, seed layer 322 is deposited using an atomic layer deposition ("ALD") process. In an alternative embodiment, the non-magnetic gap layer 322 may be deposited using a chemical vapor deposition ("CVD") process. In one embodiment, seed layer 322 comprises Ruthenium ("Ru"). In other embodiments, the layer may comprise any material having sufficient conductivity and capable of serving as a seed layer for the upper magnetic materials (i.e. the PMR main pole layer).

The magnetic plating material is deposited over the seed layer 322 to form PMR pole layer 324. Plating material layer 324 (the PMR pole layer) fills trenches 307 and 313 of first damascene layer 306A and second damascene layer 312A. Pole layer 324 may be plated with a hard magnetic material. In the illustrated embodiment, Cobalt-Iron (CoFe) is used to the plate the PMR pole layer 324. In other embodiments Cobalt-Nickel-Iron (CoNiFe) may be used. In yet other embodiments, multiple layers may be used to plate the PMR pole layer. Following plating, a planarization process such as a CMP may remove layer 314A and any plating (and seed layer material) on top of the first and second damascene layers, thereby exposing the damascene layers. FIG. 9 illustrates the exposed damascene layers.

As illustrated in the top view of FIG. 9, there are non-conformal side gap regions 330 between the side shield region 310 and the tip of pole layer region 324. Depending on the placement and geometry of the side shield and VP3 resist masks in the above described processes, the variability of the width of side gap regions may be between 10 nm to 80 nm from the ABS region to the yoke region. In the illustrated embodiment, the side gap increases with side shield throat height. In other embodiments, the side gap may decrease with side shield throat height. In yet other embodiments, non-conformal side gap regions 330 may have areas of conformity (constant side gap distance) and areas of nonconformity (i.e. varying side gap distance).

At operation 216, a resist pattern layer 332 is formed over the substrate on hard mask layer 328. As illustrated in FIG. 10, the resist pattern layer 332 protects the main pole layer 324. An etching of hard mask layer 328, using resist pattern layer 332 as a hard mask, exposes side shield region 310 for etching processes (described below). Non-conformal side gap regions 330 are also exposed. Hard mask layer 328 may comprise Tantalum (Ta), Titanium (Ti), or any other material that has a high etching selectivity with respect to the underlying materials.

Following exposure of side shield region 310, etching processes may be performed in that region. At operation 218, the first layer of damascene material 306 is wet etched to remove the material in the side shield region 310 as illustrated in FIG. 11. In this exemplary embodiment, the etchant may be so configured to only remove the first layer of damascene material 306 in side shield region 310, but not remove any, some, or all of the second layer of damascene material 312 in non-conformal side gap regions 330. Following removal of first damascene layer 306, magnetic material 302 is exposed in side shield region 310. At operation 220, the magnetic material 302 is wet etched to remove the material in the side shield region 312, as illustrated in FIG. 12. In this exemplary embodiment, the etchant may be so configured to only remove magnetic material 302 in side shield region 310, but not remove any, some, or all of the second layer of damascene material 312 in non-conformal side gap regions 330.

Table 1, below, illustrates exemplary changes in the thickness of the second damascene layer 312 after example wet etching operations 218 and 220 with 30 minute etch time. In the particular embodiment illustrated by table 1, the first damascene layer 306 comprises Al2O3, the first magnetic material comprises NiFe, and the second damascene layer comprises SiO2.

TABLE 1

SiO2 non-etch performance

| Substrate | Etchant | Etch Time (min) | Pre-etch (nm) | Post-etch (nm) |
|---|---|---|---|---|
| Si/SiO2 | Al2O3 | 30 | 31.5 | 29.33 |
| Si/SiO2 | NiFe | 30 | 21.47 | 21.31 |

Following wet etching operations 218-220, side shield region 310 may be prepared for a plating process. At operation 222, the resist pattern layer 332 is lifted off in preparation for a shield region 310 plating. At operation 224, the side shield region is plated. The plating operation 214 may include depositing a seed layer 334 over layer 328. Layer 334 serves as a seed layer for shield plating. In one embodiment, seed layer 334 is deposited using an atomic layer deposition ("ALD") process. In an alternative embodiment, seed layer 334 may be deposited using a chemical vapor deposition ("CVD") process. In one embodiment, seed layer 334 comprises Ruthenium ("Ru"). In other embodiments, the layer may comprise any material having sufficient conductivity and capable of serving as a seed layer for the upper magnetic materials (i.e. the shield magnetic layer).

The magnetic plating material is deposited over the seed layer 334 to form side shield layer 336. In one embodiment, the same material used to plate PMR pole layer 324 is also used to plate side shield layer 336. In another embodiment, a different material is used. In one embodiment, Cobalt-Iron (CoFe) is used to plate side shield layer 336. In other embodiments Cobalt-Nickel-Iron (CoNiFe) may be used. In yet other embodiments, multiple layers may be used to plate the shield layer.

In the foregoing specification, embodiments of the disclosure have been described with reference to specific exemplary features thereof. It will, however, be evident that various modifications and changes may be made thereto without departing from the broader spirit and scope of the disclosure. The specification and figures are, accordingly, to be regarded in an illustrative rather than a restrictive sense.

What is claimed is:

1. A perpendicular magnetic recording (PMR) writer configured to magnetically record data on a rotatable disk surface, the PMR writer comprising:
    a pole tip;
    side shields;
    an air-bearing surface (ABS) region;
    a yoke region comprising Silicon Dioxide (SiO2);
    side gaps, arranged respectively between the pole tip and the side shields, comprising SiO2; and
    a plurality of throat regions, a side gap width increasing with a side shield throat height above the ABS region for each of the throat regions;
    wherein the side gap width has a different width variation in each of the throat regions.

2. The PMR writer of claim 1, wherein the air boring air-bearing surface region comprises Aluminum Dioxide (Al2O3).

3. The PMR writer of claim 2, wherein the yoke region is between 100 nm and 600 nm behind the ABS region.

4. The PMR writer of claim 2, wherein the PMR writer further comprises a PMR pole layer comprising Cobalt-Iron (CoFe) or Cobalt-Nickel-Iron (CoNiFe).

5. The PMR writer of claim 1, wherein the side shields comprise Cobalt-Iron (CoFe) or Cobalt-Nickel-Iron (CoNiFe).

6. The PMR writer of claim 1, wherein each side gap varies in width between 10 nm and 80 nm from the ABS region to the yoke region.

7. The PMR writer of claim 1 wherein the side shields are plated over a seed layer comprising Ruthenium.

8. A hard disk drive, comprising:
    a perpendicular magnetic recording (PMR) writer configured to magnetically record data on a rotatable disk surface, the PMR writer comprising:
    a pole tip;
    side shields;
    an air-bearing surface (ABS) region;
    a yoke region comprising Silicon Dioxide (SiO2);
    side gaps, arranged respectively between the pole tip and the side shields, comprising SiO2; and
    a plurality of throat regions, a side gap width increasing with a side shield throat height above the ABS region for each of the throat regions;
    wherein the side gap width has a different width variation in each of the throat regions.

9. The hard disk drive of claim 8, wherein the air-bearing surface region comprises Aluminum Dioxide (Al2O3).

10. The hard disk drive of claim 9, wherein the yoke region is between 100 nm and 600 nm behind the ABS region.

11. The hard disk drive of claim 9, wherein the PMR writer further comprises a PMR pole layer comprising Cobalt-Iron (CoFe) or Cobalt-Nickel-Iron (CoNiFe).

12. The hard disk drive of claim 8, wherein the side shields comprise Cobalt-Iron (CoFe) or Cobalt-Nickel-Iron (CoNiFe).

13. The hard disk drive of claim 8, wherein each side gap varies in width between 10 nm and 80 nm from the ABS region to the yoke region.

14. The hard disk drive of claim 8 wherein the side shields are plated over a seed layer comprising Ruthenium.

\* \* \* \* \*